United States Patent [19]
Johnston, Jr.

[11] Patent Number: 6,101,204
[45] Date of Patent: *Aug. 8, 2000

[54] PROCESS FOR MAKING INTEGRATED LASER/MODULATORS

[76] Inventor: Wilbur Dexter Johnston, Jr., 30 Oak Knoll Rd., Mendham, N.J. 07945

[*] Notice: This patent issued on a continued prosecution application filed under 37 CFR 1.53(d), and is subject to the twenty year patent term provisions of 35 U.S.C. 154(a)(2).

[21] Appl. No.: 08/771,943

[22] Filed: Dec. 23, 1996

Related U.S. Application Data

[63] Continuation of application No. 08/175,808, Dec. 30, 1993, abandoned.
[51] Int. Cl.[7] ............................... H01S 3/19; H01L 21/20
[52] U.S. Cl. ............................... 372/50; 372/26; 372/102; 372/103; 438/23; 438/42
[58] Field of Search .................... 372/43, 50, 26, 372/44, 103, 102, 108; 29/569 L; 359/341; 438/23, 33, 42

[56] References Cited

U.S. PATENT DOCUMENTS

| | | | |
|---|---|---|---|
| 4,236,296 | 12/1980 | Woolhouse et al. | 29/569 L |
| 4,720,825 | 1/1988 | Akiba et al. | 372/26 |
| 4,965,525 | 10/1990 | Zah | 359/341 |

*Primary Examiner*—Rodney Bovernick
*Assistant Examiner*—Quyen Phan Leung
*Attorney, Agent, or Firm*—Hopgood, Calimafde, Kalil & Judlowe, LLP

[57] ABSTRACT

An integrated laser/modulator ("ILM") operating with reduced chirping is formed on a single semiconductor substrate. A reduction in chirping and any resultant wavelength dispersion is realized by precisely controlling the length of a window region incorporated in the ILM in order to isolate the ILM's active regions from any residual reflections.

10 Claims, 5 Drawing Sheets

PROCESS FOR MAKING INTEGRATED LASER/MODULATORS

RELATED CASES

This is Continuation of application Ser. No. 08/175,808 filed Dec. 30, 1993 now abandoned.

BACKGROUND OF THE INVENTION

The present invention pertains to a process for forming optoelectronic semiconductor devices, particularly, to a process for forming an improved semiconductor laser and to inventive semiconductor lasers formed using such process.

A semiconductor laser produces laser light when an appropriate voltage is applied. Semiconductor lasers are currently used in a wide variety of applications depending upon their output power and wavelength. A typical application for semiconductor lasers is in the field of telecommunications.

When used in telecommunications, lasers, combined with other semiconductor devices, transmit data, video, and audio information from one point to another. In designing such a transmission system it is desirable to maximize the distance between the point of transmission and point of reception. In general, the greater the distance that can be achieved between a transmitter and a receiver the less expensive is the system.

For instance, video information can be transmitted a distance of 3,000 miles in a number of ways. The preferred way would be to use a single transmitter utilizing a single laser at one end and a single receiver at the other. Lasers which are currently used in transmitters, however, can only send information over relatively short distances. As a result, electrical/electronic relays or "repeaters" are needed every 30 or 50 miles to regenerate the original signal in order to avoid losing any of the information that was originally transmitted. Thus, to transmit over a distance of 3,000 miles the installation of many repeaters is required. The installation of these repeaters is expensive and also introduces undesired complexities which reduces the overall reliability of the system.

It can thus be understood that the development of a laser based transmitter which can operate over long distances would result in the elimination of many repeaters, the net result being a cost savings to the system.

The distance over which information can be transmitted using lasers is determined by the physics of the laser itself and the optical fiber through which the laser light travels. Generally, it has been found that certain types of lasers, namely single mode lasers, are best suited for the transmission of information over great distances. Examples of such single mode lasers are distributed feedback (dfb) and distributed Bragg reflective (dBr) lasers.

In addition to a laser, a semiconductor-based transmitter must include a means of modulation along with an appropriate grating, e.g. dfb or dbr type gratings. The grating determines the output wavelength of any laser light emitted from the transmitter. Once a particular wavelength of light is selected, e.g. 1.554 microns, the information sought to be transmitted must be placed, impressed or modulated onto this lightwave "carrier", i.e. a lightwave with no information on it. Modulators are used to place an information pattern on the lightwave carrier. This information pattern directly corresponds to the information that is to be transmitted.

There are three common ways to modulate a lightwave carrier. First, the modulation may be direct, by modulating the laser driving current. Second, it may be "externally-discrete" in which the light from the laser is passed through a physically separated modulator. Finally, modulation may be "externally-integrated"; in which the modulator, while separate from the laser functionally is physically fabricated on the same semiconductor substrate. The latter two modulation schemes are usually referred to as external modulation.

Direct modulation results in wavelength as well as amplitude modulation. External modulation offers the possibility of much reduced or zero wavelength modulation. Of the two methods of external modulation, externally-integrated modulation is preferred over externally-discrete modulation for several reasons. The tradeoff, however, is that the placement of a modulator on the same semiconductor substrate as a laser, to form a so-called integrated laser/modulator ("ILM"), creates additional technical hurdles that must be overcome if the information pattern is to be correctly transmitted over a long distance.

It is imperative that phenomena called "chirping" and any related "dispersion" be limited or reduced to allow for proper transmission and reception and this in turn requires a high degree of electrical and optical isolation between the laser and modulator.

As will be recognized by those skilled in the art a certain amount of laser light of a given wavelength will not be output from the ILM. Rather, some portion of this light will be reflected; won't escape the output facet of the ILM due to "deviations" in the anti-reflective coating ("AR") placed thereon. It will be understood by those skilled in the art that a perfect AR coating, while impractical in mass-production applications, would result in zero reflections. Any "deviation" in this coating from that of a perfect AR coating causes reflections to occur. Such reflected light can cause adverse effects on the operation of the ILM. One such effect is "chirping".

Chirping occurs when this reflected light acts to change the resonant operating frequency of the laser which in turn directly acts to change the output wavelength of the ILM. Instead of outputting a continuous, narrow wavelength of light at 1.554 microns, chirping may result in the output of differing wavelengths of light, e.g. 1.553 microns, 1.555 microns, or the broadening of the desired narrow wavelength, e.g. light output encompasses both 1.554 and 1.555 microns.

The need for maintaining a certain wavelength of light, e.g. 1.555 microns, is due to the fact that the optical fiber through which such light will travel is designed to transmit light at a certain wavelength. For example, if other wavelengths of light are transmitted through an optical fiber designed to transmit light at a wavelength of 1.555 microns, such other wavelengths of light will not travel as fast through such fiber as a lightwave having a wavelength of 1.555 microns. As a result each wavelength of light which is transmitted at the same time may be received at different times instead of all at once. The delay between the arrival of differing wavelengths of light, each containing a piece of the information pattern, may result in the information pattern being unrecognizable.

This physical property of an optical fiber which results in its passing certain wavelengths of light faster than others is referred to as dispersion. It will be recognized by those skilled in the art that a reduction in chirping will result in a decrease in a given systems' "dispersion penalty" due to pulse broadening from chirping of an ILM, which in turn reduces signal deterioration.

Accordingly, it is the object of the present invention to produce an integrated laser/modulator with reduced chirping characteristics.

Another object of the present invention is to provide a repeatable and cost-effective process for mass producing integrated laser/modulators with reduced chirping characteristics.

Still another object of the invention is to provide a process for controlling the physical dimensions of an integrated semiconductor laser/modulator in order to reduce the effects of any unwanted chirping.

SUMMARY OF THE INVENTION

The present system provides a process for mass producing ILMs which operate with reduced chirping to minimize any resultant dispersion penalty in an optical fiber transmission system.

The present invention reduces the effects of chirping by first creating a "window" region having a width wider than the modulator aside it on an ILM, and secondly, controlling the length of this window region such that an optimum length is created which substantially reduces chirping without adversely affecting the possibility of coupling the output light into an optical fiber for transmission.

The process used to control the length of the window region has the added advantage of being applicable to the mass production of ILMs. This process comprises placing a "V" shaped or similar trench on one side of a semiconductor ILM chip. The position of this trench will determine where the semiconductor chip will terminate when cleaved. More importantly, the position of this trench will mark one end of the window region, the other end beginning aside the modulator located on the semiconductor. The length of this window region is therefore determined by the placement of this V-shaped trench. This length is precisely controlled to +/−10 microns or less by the inventive process.

Although the length of this window region is measured from the end of the modulator, which is an active device, the V-shaped trench, which controls its overall length, is placed on a side opposite the side on which the modulator is disposed. The modulator, grating and laser are therefore all on one side and the trench on the other. As such the trench does not interfere with the operation of these active devices and serves to define a precise location of a clean cleave to terminate the output window region.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings in which:

DESCRIPTION OF THE PREFERRED EMBODIMENT

Figure 1:
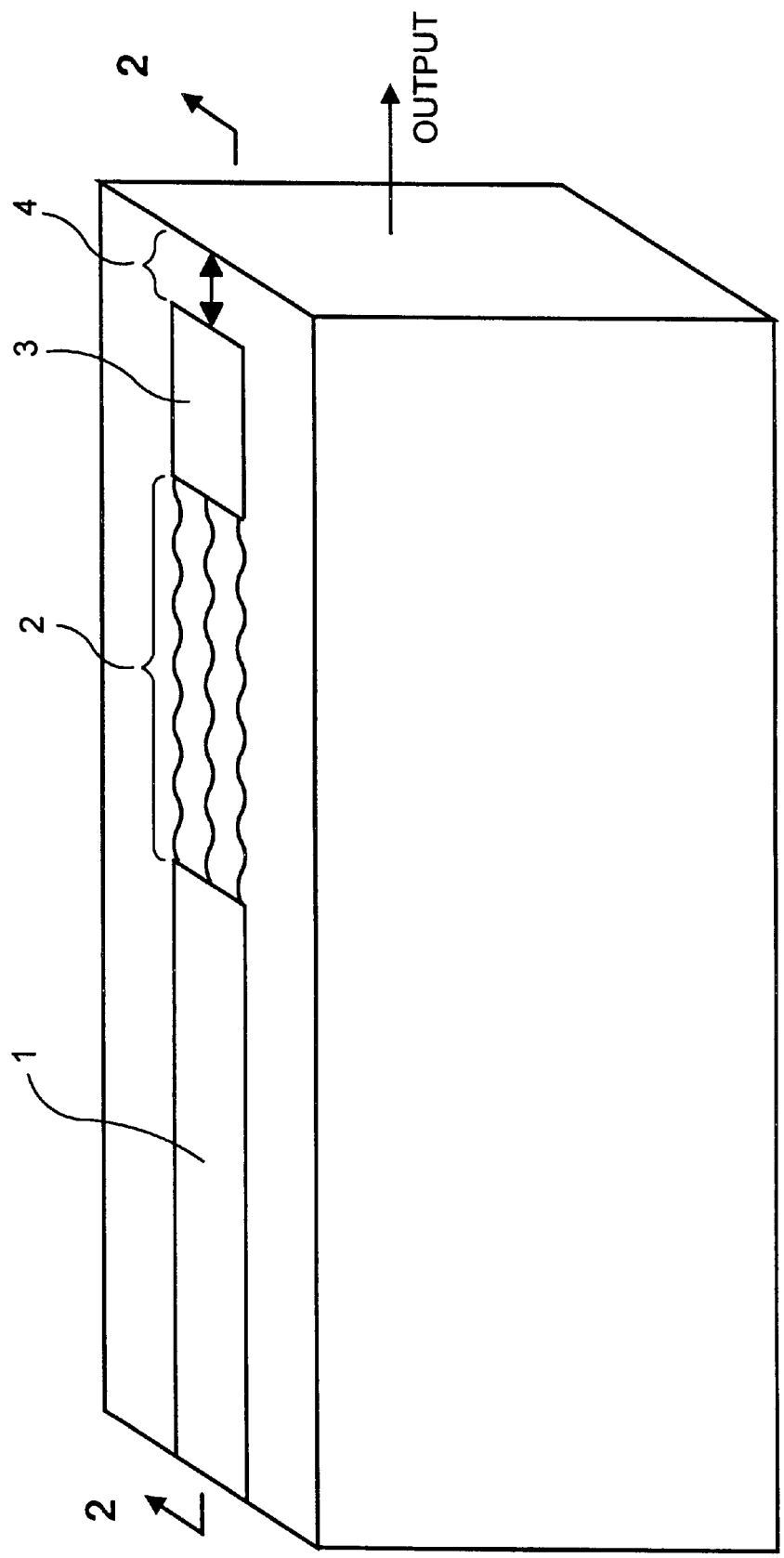
FIG. 1 is a perspective of an ILM having features of the present invention.

With respect to FIG. 1 there is shown a schematic representation of an ILM according to an embodiment of the invention which comprises a laser 1, wavelength-selective grating 2, a modulator 3, and an isolating member or window region 4.

Figure 2:
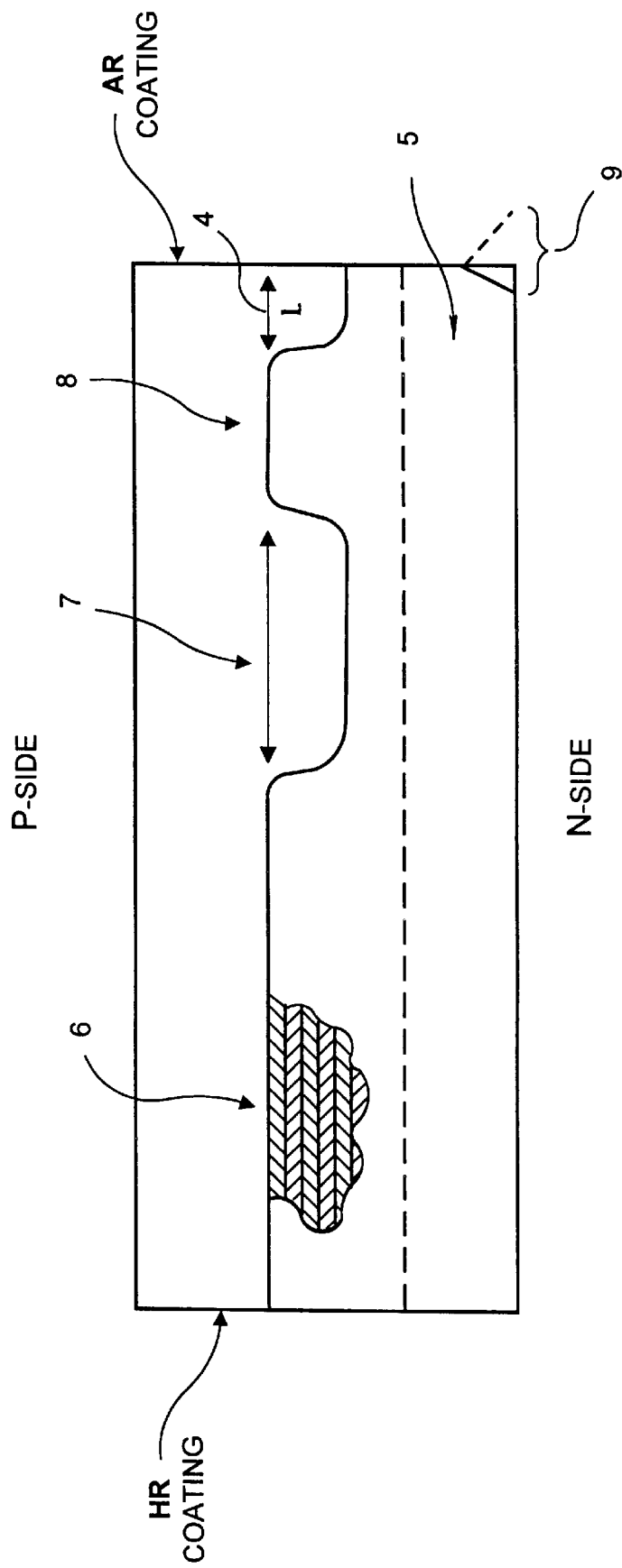
FIG. 2 is sectional view taken across A—A of the ILM shown in FIG. 1 indicating the placement of a V-shaped trench.

FIG. 2 illustrates a process for fabricating the ILM of FIG. 1 by depositing, on a side opposite an InP cut and polished wafer, or InP substrate 5, appropriate epitaxial layers of In, Ga, As, P, InP or InGaAs. Such layers being deposited, for example, by metallorganic chemical vapor deposition. Though FIG. 2 depicts the InP substrate 5 to be the n-side it should be noted that a second embodiment of the present invention comprises an p-sided InP substrate.

After deposition of the above materials the surface, e.g. p-sided surface, is thereafter worked to form an appropriate structure, i.e. laser 6, wavelength selective grating 7 and modulator 8. Taken together all three are known as the active region of an ILM.

Such a structure is created, for example, by applying an appropriate photoresist to certain sections of the p-sided surface and thereafter exposing such treated and non-treated photoresist sections to light. This step is followed by etching the appropriately exposed surface sections. This may be followed by further epitaxial growth steps, resulting in an appropriately structured ILM semiconductor. This p-sided surface will hereafter be referred to as a first side of the semiconductor.

The structure formed is then typically covered with a layer of an SiO dielectric which is itself treated with a photoresist and etched to expose desired sections of this first side to enable metal contacts to eventually be connected at these exposed points. The metal contacts being further connected to appropriate voltage sources to supply driving current to the laser section and to drive a modulating signal.

The remaining photolithographic steps used to form the laser 6, wavelength selective grating 7 and modulator 8 will not be discussed since these steps are unrelated to the inventive concepts herein disclosed. Once these sections are formed the InP window region or isolating means 4, having an appropriate length, "1", is formed.

Before describing the formation of this window region and control of its length by the placement of the V-shaped trench 9 at an appropriate and precise position, a discussion of the operation of an ILM without such a window region is appropriate. One end face (the laser end) section of the ILM is coated with a highly reflective ("HR") coating while the other (the output end face), is coated with an AR coating. A laser resonator is thereby defined by the HR coating and any effective reflection from the dBr grating or, if a dfb-type grating is used, the resonant condition of the dfb grating/active waveguide. It is this laser resonator which determines the wavelength of any laser light that is output. The purpose of the AR coating on the opposite output face is to assure that any modulated light, hereafter described, exits and does not return, e.g. by reflection, to the laser. Thus a single wavelength of light with a constant amplitude enters the modulator 8.

At this point, modulation of the selected lightwave occurs. It is here that the information to be transmitted is impressed upon the, heretofore, blank lightwave carrier. By turning the modulator 8 "on" (transmissive mode) or "off" (absorptive mode), information is impressed upon (or as the case may be, kept off) the lightwave carrier. The modulator 8 may preferably be a reverse biased p-n junction driven by a voltage source though those skilled in the art will recognize that forward biasing may be utilized as well.

As it exits the modulator and reaches the opposite end the majority of this light is output through the end coated with the AR coating. In reality, however, a small amount of this light is again reflected back through the modulator 8, due to imperfections in the AR coating. It is this small amount of reflected light from the AR coating end which, if coupled back into the laser and modulator sections, will adversely affect the information pattern being output. It is the function of the window region 4 to reduce this so-called "residual" coupled light.

The effective refractive index of a laser's active region is a function of the (1) laser's geometry, (2) layer composition, (3) strain (if any), (4) temperature, and (5) carrier density. Items 1, 2 and 3 are fixed by design and do not vary upon modulation of any emitted laser light. Though there is, on an average, wavelength shifts associated with heating, i.e. temperature changes, (item (4)) such shifts occur over relatively long periods of time. The net result being that such shifts have little effect on wavelength during the relatively short modulation pulses output from the modulator.

Figure 3:
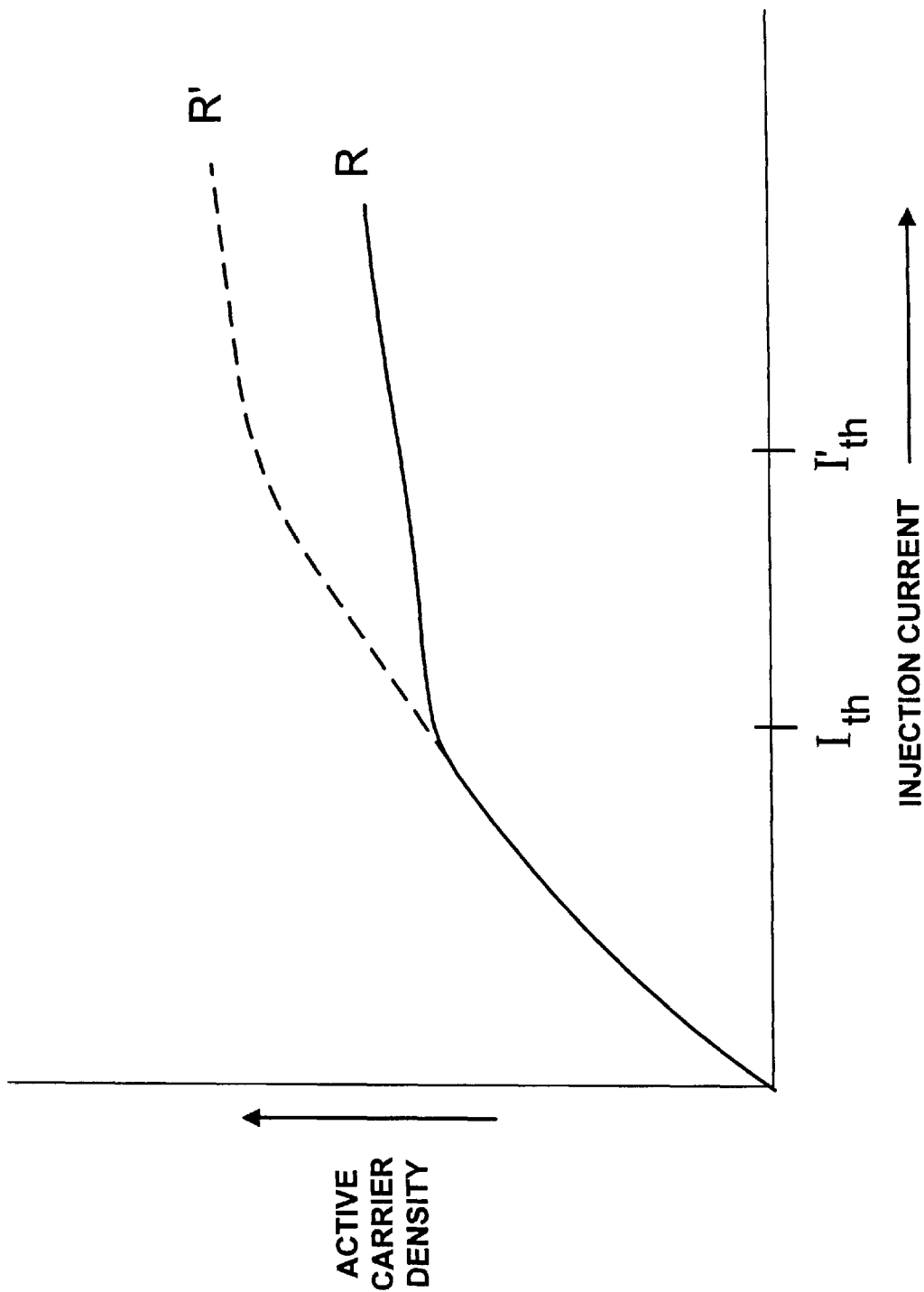
FIG. 3 is a graph showing the relationship between reflectivity and active carrier density.

Changes in the injected carrier concentration or density in the active volume of the laser, on the other hand, (item (5)) have the direct effect of changing the laser cavity's refractive index. These changes cause the wavelength of a laser to "chirp" during modulation, i.e. during the time interval which corresponds to a modulation pulse. As is well known, the refractive index effects the resonant frequency of dfB and dBr lasers, since the resonant wavelength, $\lambda$, is given by $$\lambda = 2n_{eff}\Lambda$$

where $\lambda$ is the output wavelength in air, $\Lambda$ the physical period of the dfb or dBr grating, and $n_{eff}$ the effective laser or waveguide dBr refractive index. Additionally, it is desired to keep the injection current of an ILM constant and to operate the laser in a static condition, in order to allow the carrier density to remain constant. If, however, there is any modulated light reflected back into the laser it is equivalent to increasing the effective reflectivity of the laser output face from R' to R as shown in FIG. 3. As can be seen, any change in reflectivity results in a change in threshold current $I_{th}$ as well as threshold carrier density.

As is also shown in FIG. 3, the carrier density goes from an approximately linear function of injection current to a much more slowly varying function of current at threshold $I_{th}$. Thus, assuming all other laser parameters are equal, with R'<R, a laser with a reflectivity R' requires a greater amount of injection current to reach threshold and has a higher carrier density in the active volume at a given operation than the same laser would have with an increased output reflectivity R.

The above is an AM (amplitude modulation) effect. There is also a FM (frequency modulation) effect which can produce broadening of the laser output so that it is no longer a narrow "single line". This will become deleterious should it exceed the inherent broadening required to accommodate the linewidth of the modulated signal, which for a 1554 nm laser driven at 2.5 Gbits is on the order of 0.01 nm.

This can happen since, as is well known, the refractive index of a modulator is a function of the applied electric field. A change in the refractive index causes the optical path length traversed by light going through the modulator and returning back to the laser from the imperfect output AR coated facet to change. This change in optical path length results in a change in the optical phase of the returned light. This affects both the resonant frequency and provides direct injection of a small FM signal which can be amplified in the laser cavity resulting in a broadened output wavelength.

Thus, when light is reflected back through the modulator changes, e.g. shifting or broadening, to the wavelength of emitted light result. It is desirable to minimize these changes. As stated above, there are practical limits on the minimum coatings which can be applied to laser ILM chips when they are coated in batches which are appropriate for mass production. The use of a window region provides a mechanism to reduce the coupling of this light back into the laser.

Figure 4:
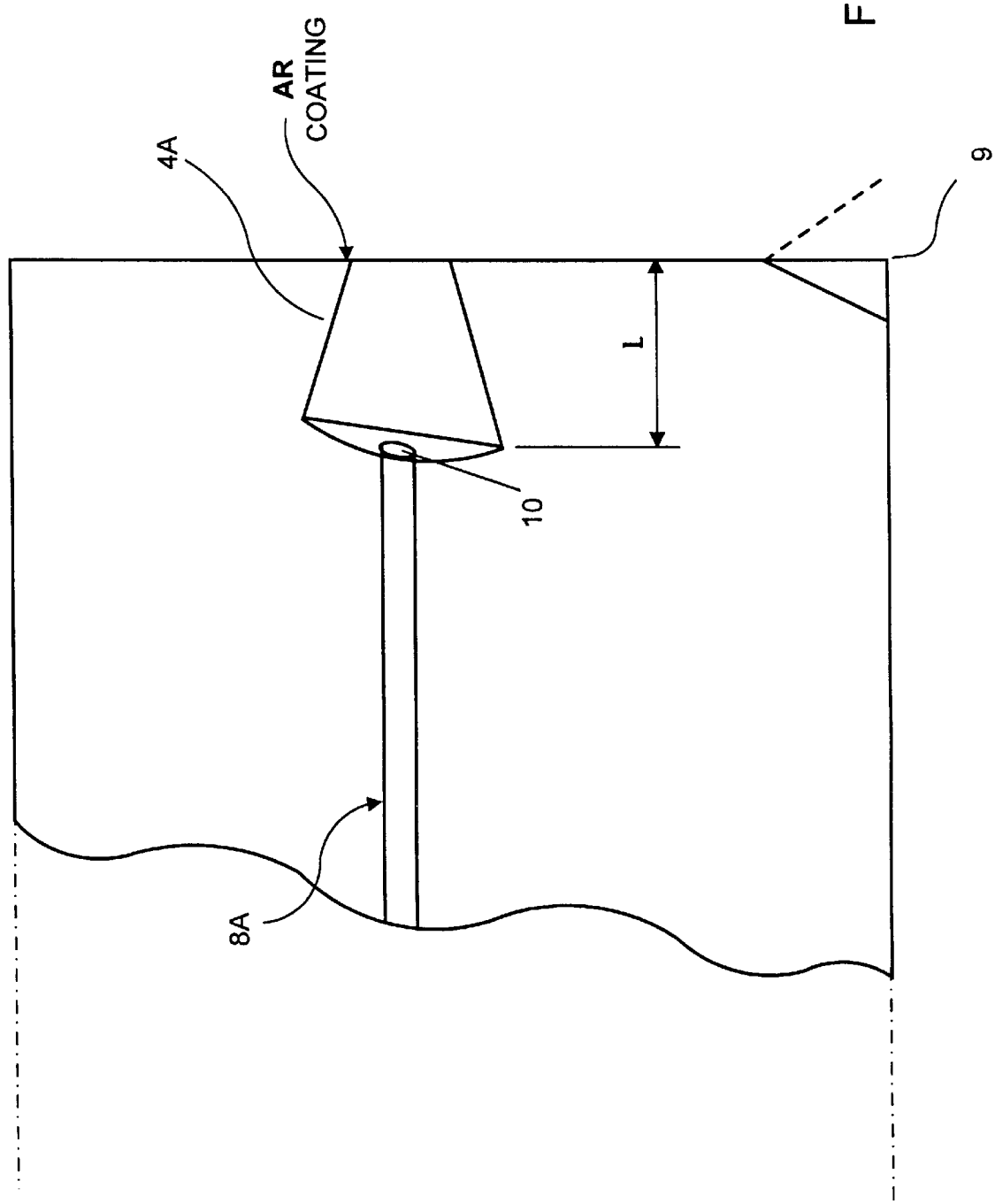
FIG. 4 is a close up view of an inventive window region.

Referring to FIG. 4 the window region 4A is located between the output of the modulator waveguide 8A and an AR coated output facet which is not a part of an optical waveguide and in which the optical beam is free to expand. On reflection, the expansion continues and the reflected beam, when it encounters the modulator waveguide 8A on return, is now much larger in diameter than the size of any originally transmitted lightwave. Coupling of this reflected beam into the modulator 8A will be reduced according to the ratio of the areas of the reflected, expanded beam and the area of the beam upon originally exiting from the modulator 8A. For typical cases where the expansion half-angle in an InP window is on the order of 5 to 8 degrees, and the length of the window region is 20 to 40 um, a reduction of residual coupled light of one to three orders of magnitude can be achieved. This may be partly offset by the fact that some addition residual reflections from the modulator exit/window entrance interface 10 will occur, since the modulator waveguide's refractive index will not exactly match the window region's refractive index. In practice, window regions reduce the effect of imperfect, output AR coatings by up to several factors of ten.

Controlling the length of this window region is critically important. If efficient forward coupling of light from an AR coated output face into a transmission fiber or another optical component was not necessary, variations in the window region's actual length (arising from mass production variations) would be inconsequential; i.e., making the window longer inherently makes efficient output coupling more difficult. If, on the other hand, light output from an ILM is to be so coupled, the shorter the window the better. Optimum lengths exist, depending on design details, but typically 40 um is a practical window length for many design combinations. Typically, a window region's length must be held to a tolerance of +/−10 microns or better. Once this length is fixed the output coupling optics may be designed. Variations in the window length beyond certain tolerances will result in improper coupling thus dictating that the window length must be controlled.

Such control can be accomplished by placing a V-shaped trench 9 at an appropriate distance from the modulator 8A forming the window region 4A.

The V-shaped trench 9 is formed by a photolithographic process using, for example, an HCL:H$_2$O etchant having a 5:1 ratio. The etchant is photolithographically applied to the backside InP substrate 5, shown in FIG. 2 as the n-side. This HCL:H$_2$O etchant must be applied on the side opposite the active devices since this etchant creates a trench which exceeds 10 microns in depth. Placing this etchant on the side where the laser 6, wavelength selective grating 7 and modulator 8 are formed would result in the etchant penetrating into these sections causing the removal of deposited material. The resulting output face would be beveled and roughened as compared to a cleaved facet, leading to a degradation of the operation of these sections.

Figure 5:
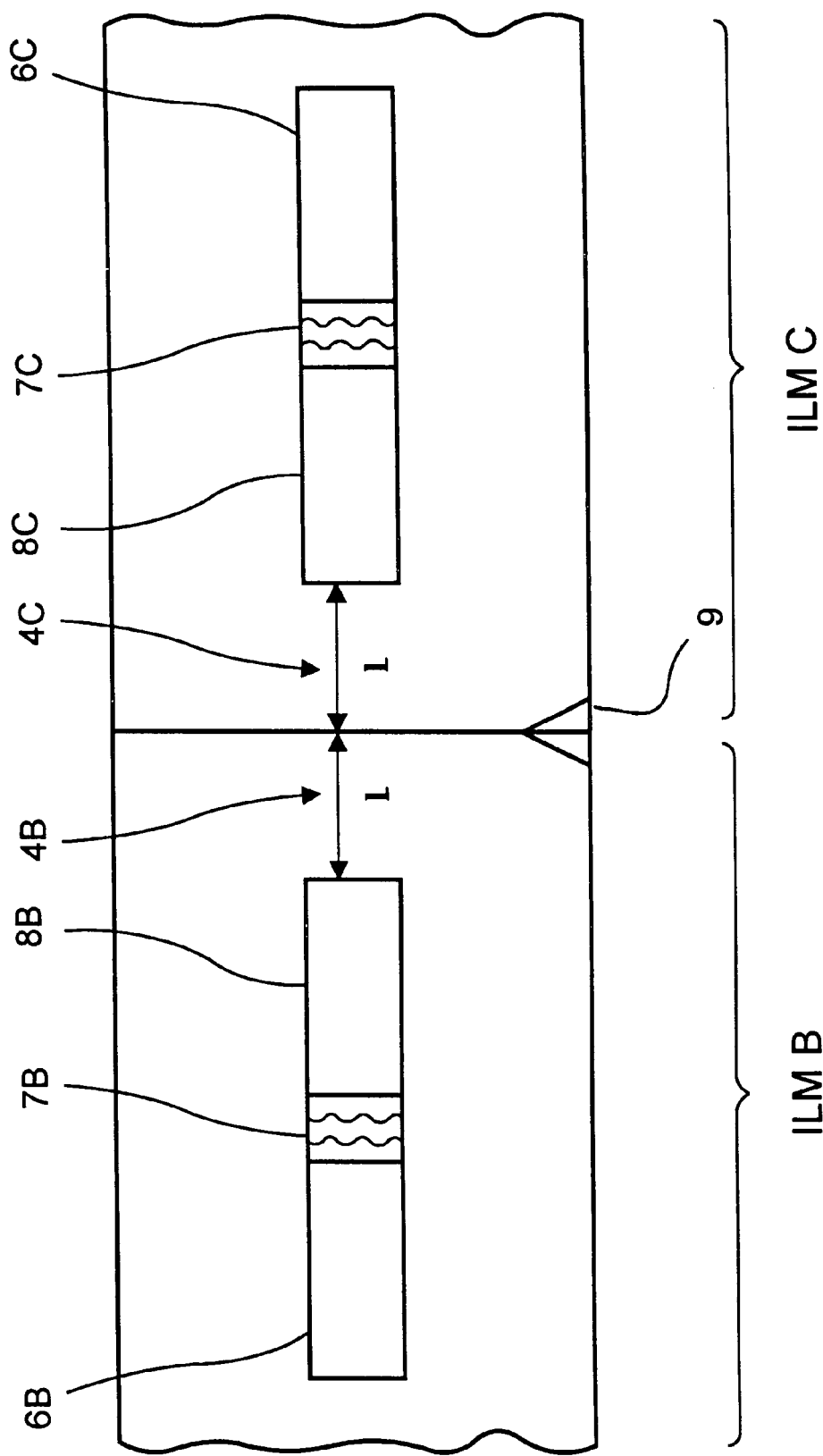
FIG. 5 is a cross-sectional view showing two ILMs of the invention as they would be formed on a common semiconductor wafer.

A V-bottomed trench having a depth of at least 10 microns assures that an appropriate stress or force at the site of the trench, i.e. using a cleaving tool, will result in the cleavage or separation of the ILM from its wafer, e.g. see FIG. 2, or another adjacent ILM, e.g. see FIG. 5, where the V-trench is aligned along the (110) cleavage plane of the substrate.

The placement of the V-shaped trench 9 can be precisely controlled to +/−1 micron photolithographically. This precise placement using photolithographic techniques allows the V-shaped trench 9 to be placed at a site which corresponds to the outside end of the ILM and window region. By controlling the placement of the trench 9 the length of the window region can also be precisely controlled. The use of a photolithographic etchant with its precise placement capabilities to position a well-defined cleave, offers significant advantages over wet etching, dry etching or mechanical scribing and cleaving; each of which has significant disadvantages as compared to the present inventive process.

As will be recognized by those skilled in the art, wet etchants are effective in forming or etching trenches on semiconductor substrates but ineffective in deep etching, as would be required to etch all the way through and separate devices due to lateral undercut of the semiconductor mask. Dry etchants are effective in producing flat-bottomed trenches but cannot create trenches with sharp V-bottoms, nor are they useful in producing deep etches which are needed for complete chip separation due to their limited etch rates and limits on attainable aspect ratios.

Mechanical scribing and cleaving is a common way to size ILMs. Such a process is inherently time consuming, requiring typically 3 or more hours to correctly scribe the necessary marks on a typical 2-inch wafer and the use of over 2500 mechanical scribes. In mass production applications, it is also difficult to obtain mechanical positioning of the scribing tool to better than +/−20 microns. In comparison, the present inventive photolithographic process results in typical time savings of 30 to 60 minutes to complete an equal number of ILMs and allows more precise location of the stress cleave or riser for cleaving.

The inventive process is particularly well suited for mass production techniques. To illustrate, it is known that it is possible to place an AR coating on the output end or facet of an ILM which would reduce the reflectivity to a level of 0.01%, thereby eliminating the need for a window region since the amount of light reflected back into the modulator 8 would be minimal. However, to achieve this low level of reflectivity requires each ILM to be individually coated, a time consuming process.

For mass production purposes it has been found that an AR coating of 0.5% (50 times the amount of reflections as compared with 0.01%) is practical and values less than or equal to this can be achieved at high yields.

Taking this amount of reflectivity into account in mass-production applications, it is then necessary to minimize the effects of these reflections. This is done by using the window region 4. It can thus be seen that the window region is the physical structure which isolates the active regions of the ILMs from reflected light provided, however, the length of such window region is precisely controlled using the inventive photolithographic process described above.

A further embodiment of the invention is shown in FIG. 5. As depicted, multiple ILMs B and C can be created on a semiconductor wafer so as to minimize the number of V-shaped trenches which must be made. For example a first ILM B, having its own laser 6B wavelength selective grating 7B modulator 8B and window region 4B is fabricated next to a second ILM C, having its own laser 6C wavelength selective grating 7C modulator 8C and window region 4C such that the two window regions 4B and 4C are aligned aside one another.

By so aligning ILMs B and C one V-shape trench 9 can be used to define the lengths of both window regions.

Having described the inventive process and resulting device in terms of a primary embodiment it will be recognized by those skilled in the art that minor equivalents or substitutes may be used. These substitutes would perform substantially the same function in substantially the same way to achieve substantially the same result. For example different etchants other than HCL:H$_2$O may be used. Similarly the optimum length of the window region may vary depending on the exact device under fabrication, however, the inventive process could be used to precisely control any given length required.

What is claimed is:

1. A process for integrating a semiconductor laser and modulator on a first side of a semiconductor operating with reduced wavelength chirping of said modulator's modulated laser output, said process comprising the steps of:

forming semiconductor laser means for outputting laser light on said first side;

forming wavelength-selective grating means for selecting a specific wavelength of said outputted laser light on said first side;

forming semiconductor modulating means having a determinable width for modulating said selected wavelength of light on said first side;

forming means for isolating said modulated and selected wavelength of light from said laser and modulating means on said first side, said isolating means further comprising a window region having an optimum length to permit tolerable reflectivity and a width wider than said modulating means;

controlling said length of said isolating means by placing a photolithographic V-shaped trench on a single semiconductor foundation substrate side of said semiconductor opposite said first side; and forming an anti-reflective coating on an end section of said isolating means.

2. The process of claim 1, wherein said length is controlled to measure between 30 and 50 microns measured from said modulating means to said end section.

3. The process of claim 2, wherein a distributed Bragg reflective grating is formed as the wavelength-selective grating means.

4. The process of claim 3, wherein said single foundation substrate side is formed from InP.

5. The process of claim 3, wherein said V-shaped trench is placed on the n-side of said semiconductor.

6. The process of claim 3, wherein said V-shaped trench is placed on the p-side of said semiconductor.

7. The process of claim 3, wherein said modulating means is formed by creating a biased p-n junction driven by a voltage source.

8. The process of claim 7, wherein said modulating means is further formed by creating a reverse biased p-n junction driven by said voltage source.

9. The process of claim 2, wherein a distributed feedback grating is formed as the wavelength-selective grating means.

10. The process of claim 9, wherein said window region is formed from InP.

* * * * *